United States Patent
Chann et al.

(10) Patent No.: US 9,136,667 B2
(45) Date of Patent: *Sep. 15, 2015

(54) HIGH PEAK POWER OPTICAL AMPLIFIER

(71) Applicant: MASSACHUSETTS INSTITUTE OF TECHNOLOGY, Cambridge, MA (US)

(72) Inventors: Bien Chann, Merrimack, NH (US); Tso Yee Fan, Belmont, MA (US); Antonio Sanchez-Rubio, Lexington, MA (US); Steven J. Augst, Acton, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 78 days.

This patent is subject to a terminal disclaimer.

(21) Appl. No.: 13/973,152

(22) Filed: Aug. 22, 2013

(65) Prior Publication Data

US 2013/0342895 A1 Dec. 26, 2013

Related U.S. Application Data

(63) Continuation of application No. 12/788,579, filed on May 27, 2010, now Pat. No. 8,531,761.

(51) Int. Cl.
| | |
|---|---|
| H01S 3/13 | (2006.01) |
| G03F 7/20 | (2006.01) |
| H01S 3/00 | (2006.01) |
| H01S 3/067 | (2006.01) |
| H01S 3/23 | (2006.01) |
| H04B 10/564 | (2013.01) |

(52) U.S. Cl.
CPC .......... *H01S 3/1307* (2013.01); *G03F 7/70033* (2013.01); *G03F 7/7085* (2013.01); *H01S 3/0057* (2013.01); *H01S 3/2391* (2013.01); *H01S 3/005* (2013.01); *H01S 3/0071* (2013.01); *H01S 3/0085* (2013.01); *H01S 3/0092* (2013.01); *H01S 3/06754* (2013.01); *H01S 3/2308* (2013.01); *H04B 10/564* (2013.01)

(58) Field of Classification Search
CPC .................................... H01S 3/2391
USPC .................. 398/75, 77, 78, 89, 185
See application file for complete search history.

(56) References Cited

U.S. PATENT DOCUMENTS

| | | |
|---|---|---|
| 4,467,468 A | 8/1984 | Miller |
| 4,817,207 A | 3/1989 | Smith et al. |

(Continued)

FOREIGN PATENT DOCUMENTS

| | | |
|---|---|---|
| DE | 19811032 A1 | 10/1998 |
| EP | 0938197 A2 | 8/1999 |

(Continued)

OTHER PUBLICATIONS

August, Steven J. et al., "Beam Combining of Ytterbium Fiber Amplifiers (Invited)," Journal of Optical Social America B., vol. 24, No. 8, Aug. 2007.

(Continued)

*Primary Examiner* — Ari M Diacou
(74) *Attorney, Agent, or Firm* — Lando & Anastasi, LLP

(57) ABSTRACT

A method and apparatus for providing a high peak power optical beam. The method includes interleaving pulse trains of different wavelengths and spatially and temporally overlapping the different wavelengths to produce an amplified output beam with very high peak power.

27 Claims, 12 Drawing Sheets

(56) References Cited

U.S. PATENT DOCUMENTS

| | | | |
|---|---|---|---|
| 4,961,195 A | 10/1990 | Skupsky et al. |
| 5,005,166 A | 4/1991 | Suzuki et al. |
| 5,009,658 A | 4/1991 | Damgaard-Iversen et al. |
| 5,010,543 A | 4/1991 | Hill |
| 5,076,672 A | 12/1991 | Tsuda et al. |
| 5,095,478 A | 3/1992 | Taki et al. |
| 5,095,487 A | 3/1992 | Meyerhofer et al. |
| 5,319,484 A | 6/1994 | Jacob et al. |
| 5,325,222 A | 6/1994 | Jacob et al. |
| 5,329,396 A | 7/1994 | Fishman et al. |
| 5,404,240 A | 4/1995 | Nishio et al. |
| 5,589,967 A | 12/1996 | Auffret |
| 5,631,758 A | 5/1997 | Knox et al. |
| 5,694,408 A | 12/1997 | Bott et al. |
| 5,861,965 A | 1/1999 | Koren et al. |
| 5,892,607 A | 4/1999 | Atlas |
| 6,061,369 A | 5/2000 | Conradi |
| 6,100,831 A | 8/2000 | Frankel |
| 6,167,075 A | 12/2000 | Craig et al. |
| 6,192,062 B1 | 2/2001 | Sanchez-Rubio et al. |
| 6,212,310 B1 | 4/2001 | Waarts et al. |
| 6,252,693 B1 | 6/2001 | Blauvelt |
| 6,275,632 B1 | 8/2001 | Waarts et al. |
| 6,307,668 B1 | 10/2001 | Bastien et al. |
| 6,327,068 B1 | 12/2001 | Silberberg et al. |
| 6,327,292 B1 | 12/2001 | Sanchez-Rubio et al. |
| 6,330,388 B1 | 12/2001 | Bendett et al. |
| 6,356,576 B1 | 3/2002 | Smith |
| 6,381,048 B1 | 4/2002 | Chraplyvy et al. |
| 6,400,871 B1 | 6/2002 | Minden |
| 6,434,175 B1 | 8/2002 | Zah |
| 6,570,704 B2 | 5/2003 | Palese |
| RE38,289 E | 10/2003 | Bergano |
| 6,678,294 B1 | 1/2004 | Komine et al. |
| 6,763,054 B2 | 7/2004 | Whitley |
| 6,775,478 B2 | 8/2004 | Suzuki et al. |
| 7,020,168 B2 | 3/2006 | Bernasconi et al. |
| 7,110,168 B2 | 9/2006 | Lee et al. |
| 7,199,924 B1 | 4/2007 | Brown et al. |
| 7,239,777 B1 | 7/2007 | Christensen et al. |
| 7,271,949 B2 | 9/2007 | Kim et al. |
| 7,272,319 B1 | 9/2007 | Piccirilli et al. |
| 7,298,711 B1 | 11/2007 | Jarcy |
| 7,298,771 B2 | 11/2007 | Volodin et al. |
| 7,339,727 B1 | 3/2008 | Rothenberg et al. |
| 7,340,172 B2 | 3/2008 | Giles et al. |
| 7,346,085 B1 | 3/2008 | Rothenberg et al. |
| 7,376,349 B2 | 5/2008 | Ionov et al. |
| 7,436,588 B2 | 10/2008 | Rothenberg et al. |
| 7,440,174 B2 | 10/2008 | Rice et al. |
| 7,468,832 B2 | 12/2008 | Rothenberg et al. |
| 7,574,139 B2 | 8/2009 | Fu et al. |
| 7,620,324 B2 | 11/2009 | Minato et al. |
| 7,653,096 B2 | 1/2010 | Kawai |
| 7,702,240 B2 | 4/2010 | Minato |
| 7,764,720 B1 | 7/2010 | Bronder et al. |
| 7,953,129 B2 | 5/2011 | Kawai |
| 8,023,538 B2 | 9/2011 | Marcinkevicius et al. |
| 8,049,966 B2 | 11/2011 | Chann et al. |
| 8,125,704 B2 | 2/2012 | Mielke et al. |
| 8,179,594 B1 | 5/2012 | Tidwell et al. |
| 8,184,361 B2 | 5/2012 | Rothenberg et al. |
| 8,184,363 B2 | 5/2012 | Rothenberg |
| 8,200,047 B1 | 6/2012 | Kowalczyk |
| 8,531,761 B2 | 9/2013 | Chann et al. |
| 8,531,772 B2 | 9/2013 | Chann et al. |
| 8,614,853 B2 | 12/2013 | Chann et al. |
| 2001/0017720 A1 | 8/2001 | Hait |
| 2001/0017721 A1 | 8/2001 | Hait |
| 2002/0126346 A1 | 9/2002 | Suzuki et al. |
| 2003/0095737 A1 | 5/2003 | Welch et al. |
| 2003/0219205 A1 | 11/2003 | Volodin et al. |
| 2004/0052278 A1 | 3/2004 | Kane et al. |
| 2004/0057475 A1 | 3/2004 | Frankel et al. |
| 2004/0095983 A1 | 5/2004 | Whitley |
| 2005/0002424 A1 | 1/2005 | Bernasconi et al. |
| 2006/0120418 A1 | 6/2006 | Harter et al. |
| 2006/0153254 A1 | 7/2006 | Franjic et al. |
| 2006/0171428 A1 | 8/2006 | Volodin |
| 2006/0257150 A1 | 11/2006 | Tsuchiya et al. |
| 2006/0291862 A1 | 12/2006 | Kawai |
| 2007/0047608 A1 | 3/2007 | Volodin et al. |
| 2007/0078449 A1 | 4/2007 | Hayashi et al. |
| 2007/0086010 A1 | 4/2007 | Rothenberg |
| 2007/0165624 A1 | 7/2007 | Saito et al. |
| 2007/0201795 A1 | 8/2007 | Rice et al. |
| 2007/0280325 A1 | 12/2007 | Wang |
| 2008/0084598 A1 | 4/2008 | Rothenberg et al. |
| 2008/0084605 A1 | 4/2008 | Rothenberg et al. |
| 2008/0085128 A1 | 4/2008 | Rothenberg et al. |
| 2008/0089698 A1 | 4/2008 | Jiang et al. |
| 2009/0201575 A1 | 8/2009 | Fermann et al. |
| 2010/0073658 A1 | 3/2010 | Kawai |
| 2010/0110556 A1 | 5/2010 | Chann et al. |
| 2011/0032602 A1 | 2/2011 | Rothenberg |
| 2011/0032603 A1 | 2/2011 | Rothenberg |
| 2011/0032604 A1 | 2/2011 | Rothenberg et al. |
| 2011/0147566 A1 | 6/2011 | Furuya et al. |
| 2011/0222574 A1 | 9/2011 | Chann et al. |
| 2011/0280581 A1 | 11/2011 | Chann et al. |
| 2011/0292498 A1 | 12/2011 | Chann et al. |
| 2011/0305250 A1 | 12/2011 | Chann et al. |
| 2012/0014397 A1 | 1/2012 | Chann et al. |
| 2012/0188626 A1 | 7/2012 | Rothenberg et al. |
| 2012/0200439 A1 | 8/2012 | Hartl et al. |
| 2012/0212801 A1 | 8/2012 | Rothenberg |
| 2012/0212802 A1 | 8/2012 | Rothenberg et al. |
| 2012/0219021 A1 | 8/2012 | Lippey et al. |
| 2013/0063808 A1 | 3/2013 | Rothenberg |

FOREIGN PATENT DOCUMENTS

| | | |
|---|---|---|
| JP | 2007165624 A | 6/2007 |
| WO | 02071119 A1 | 9/2002 |
| WO | 2006012463 A2 | 2/2006 |
| WO | 2006097531 A1 | 9/2006 |
| WO | 2006012463 A3 | 11/2007 |
| WO | 2008127451 A2 | 10/2008 |
| WO | 2011109753 A1 | 9/2011 |

OTHER PUBLICATIONS

Bates, Harry et al., "Picosecond Pulse Stacking in Calcite," Applied optics vol. 18, No. 7, Apr. 1, 1979.

Chann, B. et al, "Frequency Narrowed External Cavity Diode Laser Array Bar," Optics Letters, vol. 25, No. 18, Sep. 15, 2000.

Clarkson, W. A., et al., "Two-Mirror Beam-Shaping Technique for High-Power Diode Bars," Optics Letters, vol. 21, No. 6, Mar. 15, 1996.

Dawson, Jay W. et al, "Analysis of the Scalability of Diffraction-Limited Fiber Lasers and Amplifiers to High Average Power," Optics Express, vol. 16, No. 17, Aug. 18, 2008.

Fan, T. Y., "Laser Beam Combining for Hihg-Power, High-Radiance Sources," IEEE Journal of Selected Topics in Quantum Electronics, vol. 11, No. 3, May/Jun. 2005.

Gopinath, J. T. et al., "1450nm High Brightness Wavelength Beam Combined Diode Laser Array," Optics Express, vol. 16, No. 13, Jun. 23, 2008.

Loftus, Thomsa H. et al, "Spectrally Beam-Combined Fiber Lasers for High-Average-Power Applications," IEEE Journal of Selected Topics in Quantum Electronics, vol. 13, No. 3, May/Jun. 2007.

Zhou, Shain et al., "Divided-Pulse Amplification of Ultrashort Pulses," Optics Letters, vol. 32, No. 7, Apr. 1, 2007.

Zhu, H, et al., "Sepctrally Narrowed External-Cavity High-Power Stack of Laser Diode Arrays," Optics Letters, vol. 30, No. 11, Jun. 1, 2005.

HIGH PEAK POWER OPTICAL AMPLIFIER

CROSS-REFERENCE TO RELATED APPLICATIONS

This application is a continuation of, and claims priority under 35 U.S.C. 120 to, co-pending U.S. application Ser. No. 12/788,579 filed May 27, 2010, which is herein incorporated by reference in its entirety.

FEDERALLY SPONSORED RESEARCH

This invention was made with government support under Grant No FA8721-05-C-0002 awarded by the United States Air Force. The U.S. government has certain rights in this invention.

BACKGROUND

1. Field of Invention

The present invention relates generally to the field of lasers and, more particularly, to methods and apparatus for optical laser amplification.

2. Discussion of Related Art

Optical amplifiers are used in laser systems for many different applications including, for example, materials processing, laser pumping and numerous medical procedures. Lasers having very high output power levels are desired for several of these applications, as well as for other applications, such as, for example, laser fusion and high harmonic generation, military weapons, industrial cutting and welding, and free-space laser communication applications. Currently, portable lasers having power output levels of up to 10 kW at output wavelengths of interest are available. Should an application require a greater power output level or higher brightness, some form of beam combining is conventionally performed. Conventional beam combining systems include Wavelength Beam Combining (WBC) and Coherent Beam Combining (CBC) systems.

SUMMARY OF INVENTION

Aspects and embodiments are directed to a method and apparatus for providing a high peak power optical beam based on interleaving pulse trains of different wavelengths and spatially and temporally overlapping the different wavelengths to produce an amplified output beam with very high peak power.

According to one embodiment, an optical amplifier system comprises a plurality of seed laser sources each configured to generate an optical beam having a unique wavelength to provide a plurality of wavelengths, first delay optics configured to uniquely delay each wavelength of the plurality of wavelengths to provide a waveform comprising a time series of the plurality of wavelengths, an amplifier configured to receive the waveform and to amplify each wavelength of the plurality of wavelengths to provide an amplified waveform comprising a time series of a corresponding plurality of amplified wavelengths, and second delay optics configured to temporally overlap the plurality of amplified wavelengths to provide an output beam.

The optical amplifier system may further comprise dispersive optics optically coupled between the amplifier and the second delay optics and configured to receive the spatially spectrally disperse the amplified waveform. In one example, the dispersive optics comprises at least one of a wavelength division de-multiplexer, a diffraction grating, a beam splitter, and a mirror. In one example, the optical amplifier system further comprises a transform lens optically coupled to the second delay optics and configured to receive the plurality of amplified wavelengths that have been temporally overlapped by the second delay optics and to spatially overlap the plurality of amplified wavelengths to form the output beam, and a grating optically coupled to the transform lens and positioned a focal length from the transform lens at a region of overlap of the plurality of amplified wavelengths, the grating configured to transmit the output beam. In another example, the optical amplifier system further comprises a non-linear crystal, a beam splitter configured to deflect a portion of the output beam to the non-linear crystal, a photo-detector optically coupled to the non-linear crystal and configured to detect a beam from the non-linear crystal, and a phase controller optically coupled to the photo-detector and to the wavelength division de-multiplexer, the phase controller being configured to receive a detected beam from the photo-detector and to adjust a phase of each wavelength in the detected beam so as to sum electromagnetic fields of the plurality of amplified wavelengths. In one example, the phase controller is a stochastic parallel gradient descent phase controller. In another example, the dispersive optics comprises a first diffraction grating optically coupled to the amplifier and configured to spatially spectrally disperse the plurality of amplified wavelengths, and a second diffraction grating optically coupled to the first diffraction grating and configured to redirect the plurality of amplified wavelengths into parallel beams. The second delay optics may comprise, for example, a two-mirror beam shaper configured to receive the parallel beams and to uniquely delay each wavelength of the plurality of amplified wavelengths to temporally overlap the plurality of amplified wavelengths to provide the output beam.

In another example, the dispersive optics and the second delay optics together comprise a polarization beam splitter optically coupled to the amplifier, a quarter wave plate optically coupled to the polarization beam splitter, and a series of volume Bragg gratings optically coupled to the quarter wave plate and configured to uniquely delay each wavelength of the plurality of amplified wavelengths to temporally overlap the plurality of amplified wavelengths to provide an output beam. The polarization beam splitter and quarter wave plate may be replaced with a Faraday circulator. In another example, the optical amplifier system further comprises a wavelength division multiplexer configured to spatially overlap the plurality of wavelengths to form a first beam. The optical amplifier system may further comprise an amplitude modulator configured to receive the first beam and to amplitude modulate the first beam to form a modulated beam. The optical amplifier system may further comprise a wavelength division demultiplexer configured to receive the modulated beam and to spatially spectrally disperse the modulated beam into a plurality of modulated wavelengths, wherein the first delay optics are optically coupled to the wavelength division demultiplexer and configured to receive and uniquely delay each wavelength of the plurality of modulated wavelengths. In one example, the first and/or second delay optics comprises an array of optical fibers having different lengths.

According to another embodiment, a method of producing a high peak power output optical beam comprises acts of uniquely delaying each wavelength of a plurality of wavelengths to temporally interleave the plurality of wavelengths to form a waveform comprising a time series of the plurality of wavelengths, amplifying each wavelength of the plurality of wavelengths to provide an amplified waveform comprising a time series of a corresponding plurality of amplified wavelengths, and uniquely delaying each amplified wavelength to temporally overlap the plurality of amplified wavelengths to provide the output optical beam.

In one example, the method further comprises spatially spectrally dispersing the plurality of amplified wavelengths prior to temporally overlapping the plurality of amplified wavelengths, and spatially overlapping the plurality of amplified wavelengths, after temporally overlapping the plurality of amplified wavelengths, to form the output optical beam. In another example, the method further comprises phasing the plurality of amplified wavelengths. In another example, the method further comprises spatially overlapping the plurality of wavelengths to form an input optical beam, amplitude modulating the input optical beam to provide a modulated beam, and spatially spectrally dispersing the modulated beam to provide the plurality of wavelengths. In another example in which the plurality of wavelengths corresponds to a plurality of pulses, the method may further comprise stretching each pulse of the plurality of pulses to provide a plurality of stretched pulses, amplifying the plurality of stretched pulses to provide a plurality of amplified stretched pulses, and recompressing the plurality of amplified stretched pulses to provide the plurality of amplified wavelengths. Stretching each pulse may comprise, for example, dividing each pulse of the plurality of pulses into a plurality of smaller amplitude pulses.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

Figure 1:
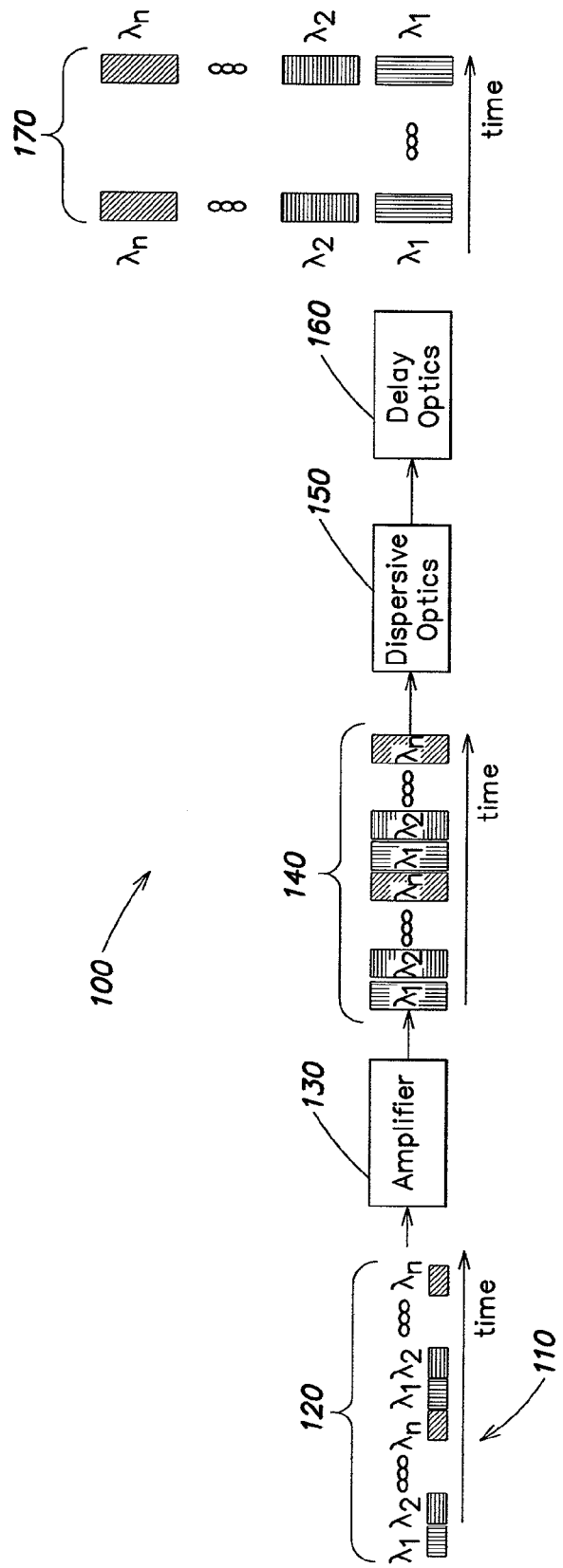
FIG. 1 is a block diagram of one example of a high peak power optical amplifier system according to aspects of the invention.

There is significant interest in building pulsed laser systems capable of generating very high peak power, for example 1 MegaWatt (MW) or higher. As discussed above, there are many examples of applications that can benefit greatly from very high peak power laser amplifiers. Another example is a laser-generated extreme ultraviolet (EUV) light source at a wavelength of approximately 13.5 nanometers (nm), which can be used for several applications, including lithography, high precision lidar, and materials processing. The source requirements for such a laser-generated EUV light source presently include, for example, an average power output of approximately 10 kW to 20 kW, and nanosecond-class pulse width with a pulse repetition rate of at least 7 kilohertz (kHz). There are very few conventional lasers that can meet these requirements, and those that can meet the requirements tend to be very large, inefficient, and expensive.

Aspects and embodiments are directed to a pulsed laser system in which very high peak power can be generated from a single laser amplifier. Systems according to various embodiments are based on interleaving pulse trains of different wavelengths and spatially and temporally overlapping the different wavelengths to produce an amplified output beam with very high peak power, as discussed in detail below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Furthermore, although the following discussion may refer primarily to fiber lasers as an example, the aspects and embodiments discussed herein are applicable to any type of laser that is wavelength-selectable, including, but not limited to, semiconductor lasers, diode lasers and fiber lasers.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 2:
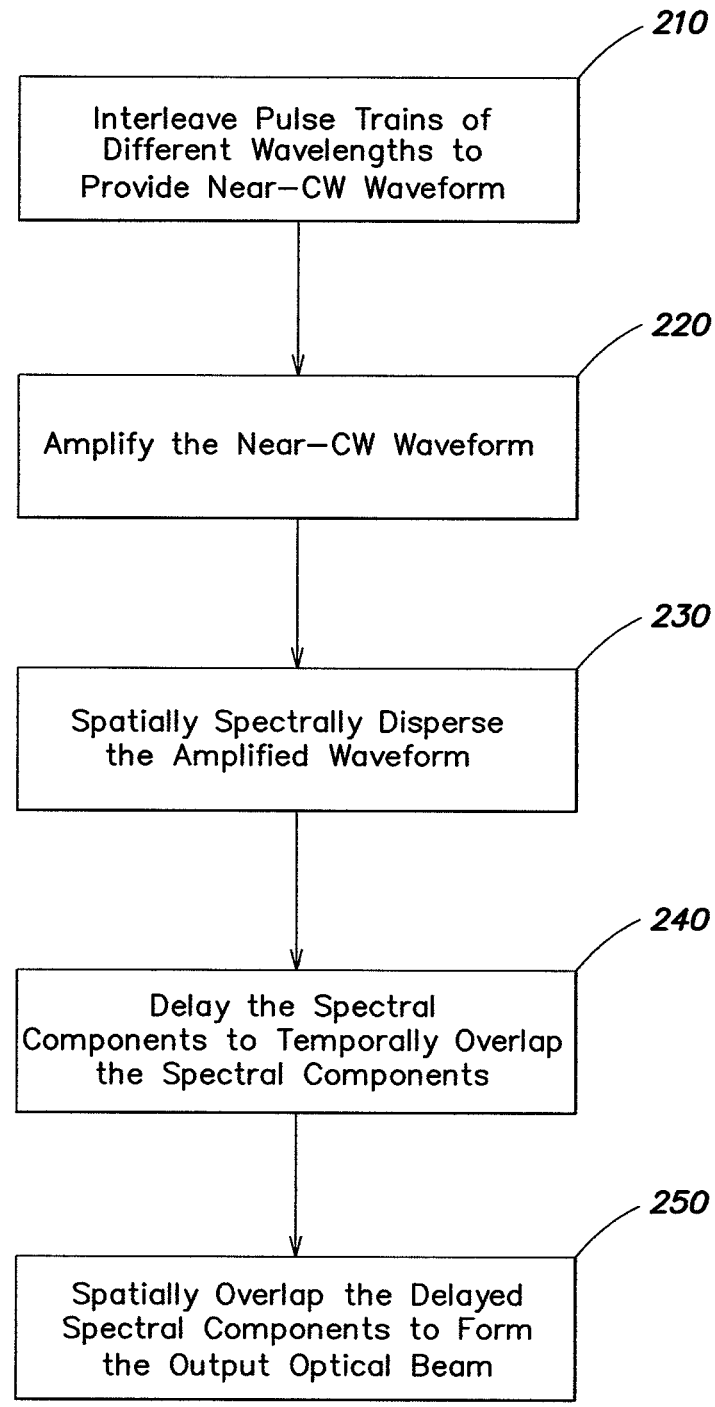
FIG. 2 is a flow diagram illustrating one example of a method of generating a high power optical beam according to aspects of the invention.

Referring to FIG. 1, there is illustrated a block diagram of one embodiment of a system architecture for generating a very high peak power optical amplifier. The system operates by delaying and interleaving pulse trains of different wavelengths to form a nearly continuous-wave power waveform beam, amplifying the beam, and then spatially and temporally overlapping the delayed wavelengths to form an amplified output beam. In one example, the output beam is formed by spatially spectrally dispersing the amplified beam, delaying each spectral component of the amplified beam to temporally overlap the spectral components, and spatially recombining the spectral components into a single output beam. In this manner, an output optical beam with very high peak power can be generated, as discussed in more detail below. FIG. 2 illustrates a flow diagram of an example of a method of generating the high power optical beam using the system of FIG. 1. The operation of the system of FIG. 1, and other system embodiments, is discussed below with continuing reference to FIG. 2. The system may operate using waveforms that include repeating multi-wavelength pulses, and therefore the method may be repeated for each multi-wavelength pulse.

According to one embodiment, the system 100 includes an array 110 of pulsed seed laser sources, each seed laser source generating an optical beam with a unique wavelength, $\lambda_i$, where i is an integer from 1 to n, with n being the number of seed laser sources in the array 110. The type of seed laser sources, and specific properties or characteristics of the seed laser sources, may depend on the application of the system 100 and/or user specifications. In step 210 (FIG. 2), all the wavelengths $\lambda_1$-$\lambda_n$ are time-multiplexed into a single power waveform beam 120, as shown in FIG. 1. Ideally, this power waveform beam 120 is a nearly continuous-wave (CW) power waveform beam. That is, the spectral components are arranged serially in time from $\lambda_1$-$\lambda_n$ (thus forming a time series of wavelengths, which maybe repeated), as shown in FIG. 1, with a small space between each unique wavelength/spectral component. The waveform 120 is amplified by an amplifier 130 to generate an amplified output beam 140 (step 220 in FIG. 2). Because the spectral components are spaced apart in time, each wavelength is amplified individually. In one example, each wavelength $\lambda_i$ of the input beam 120 can be amplified until it is limited by non-linearities such as bulk damage (for example, thermal fracturing, melting, and thermal lensing), stimulated Brillouin scattering (SBS), stimulated Raman scattering (SRS), self phase modulation, cross phase modulation, etc. In one example, the level of amplification can be set based on foreknowledge of the amplification limit for the type of seed laser sources and type of amplifier used in the system and based on a desired output power from the system. The amplifier 130 may be any type of laser amplifier, including a fiber laser amplifier.

Still referring to FIGS. 1 and 2, the output beam 140 from the amplifier 130 is then spatially dispersed into its spectral components (step 230 in FIG. 2) using dispersive optics 150. The dispersive optics may include, for example, a wavelength division de-multiplexer, gratings (such as diffraction gratings), beam splitters, mirrors, and/or other dispersive optics, as discussed further below. Each spectral component is then delayed uniquely using delay optics 160 (step 240 in FIG. 2) to temporally overlap the spectral components, as shown in FIG. 1 (170). The delayed and temporally overlapped spectral components are then spatially overlapped (step 250 in FIG. 2) to form the output optical beam 170.

Figure 3:
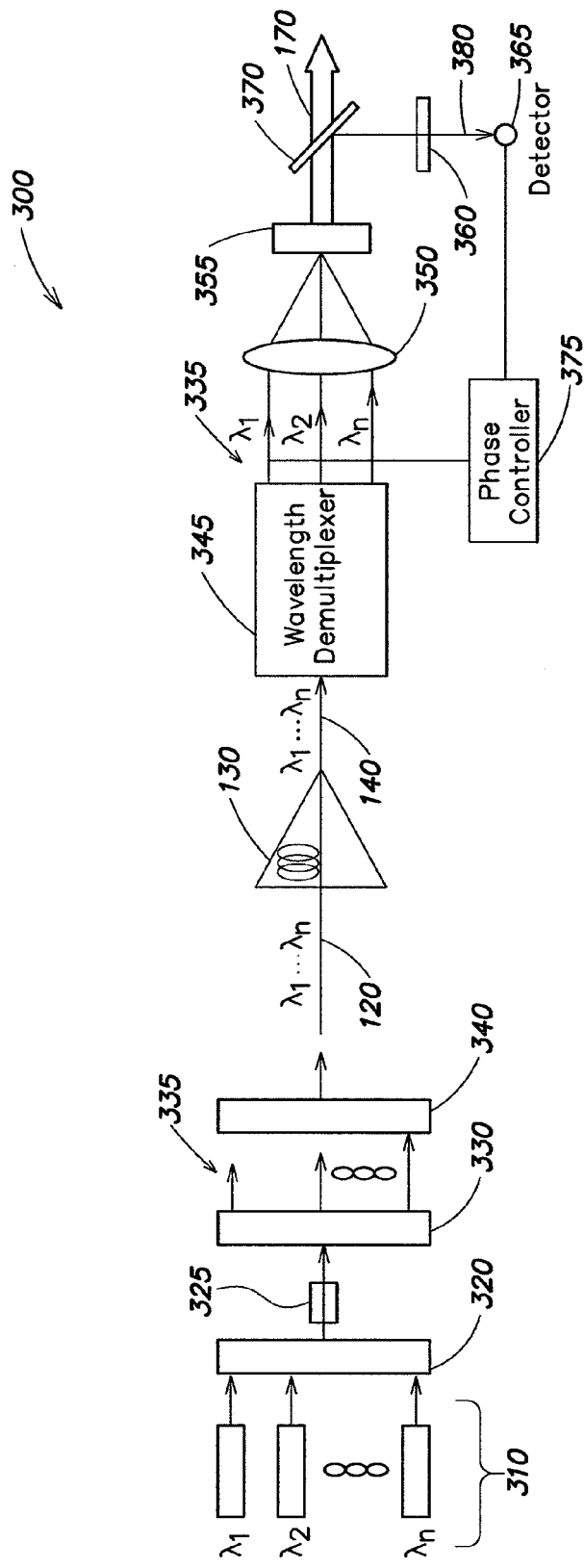
FIG. 3 is a block diagram of another example of a high peak power optical amplifier system according to aspects of the invention.
Figure 4A:
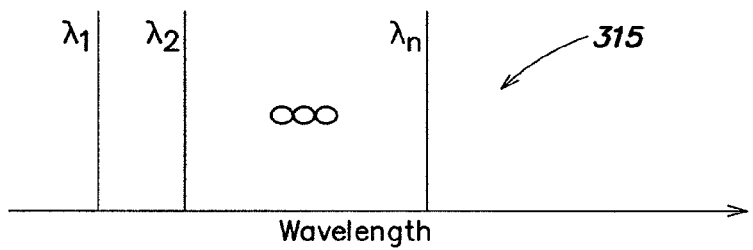
FIG. 4A is a diagram of one example of an input waveform to the system of FIG. 3.

Another embodiment of a high peak power laser system is illustrated in FIG. 3. The embodiment illustrated in FIG. 3 uses a fiber amplifier for the amplifier 130; however, as discussed above, any type of laser amplifier may be used. According to one embodiment, the seed array 110 comprises an array of CW low power master oscillators 310, each master oscillator producing an optical beam at a different wavelength $\lambda$. Thus, an array 310 of n master oscillators produces input wavelengths $\lambda_1$-$\lambda_n$, as shown in FIG. 3. The array of master oscillators 310 may be replaced by a single (or more than one) mode-locked master oscillator (not shown) that produces the spectral components with wavelengths $\lambda_1$-$\lambda_n$. An example of the input waveform 315 from the array of master oscillators 310 is illustrated in FIG. 4A. The master oscillators are termed "low power" because their output power is relatively low compared to the output power from the system as a whole. The high power output beam is achieved through amplification and the interleaving and combining of the pulses with different wavelengths, as discussed herein, and therefore the system can use relatively low power master oscillators 310.

Figure 5:
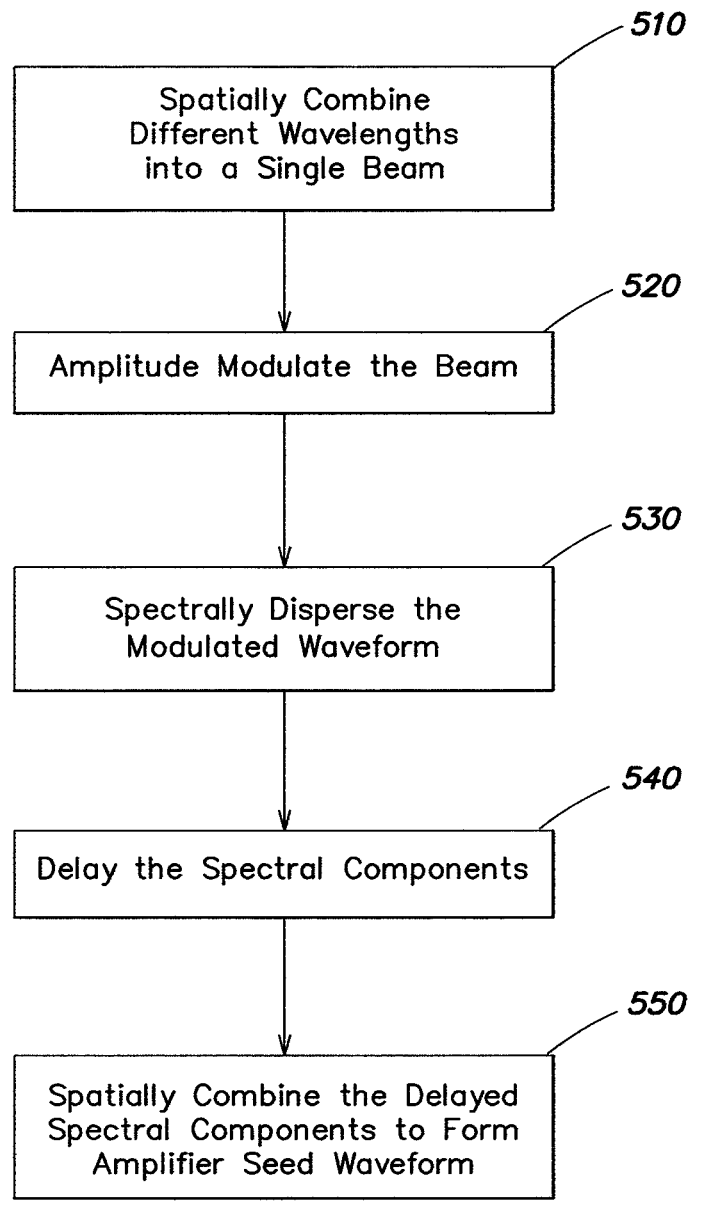
FIG. 5 is a flow diagram illustrating one example of a method of time multiplexing pulse trains of different wavelengths.

As discussed above with reference to FIG. 2, step 210 includes interleaving pulse trains of different wavelengths which allows each wavelength to be individually amplified and therefore increases the power in the optical beam. This may be achieved in several steps, as shown in FIG. 5, using embodiments of the system illustrated in FIG. 3. According to one embodiment, the wavelengths from the array of master oscillators 310 are spatially combined into a single beam using a wavelength division multiplexer 320 (step 510 in FIG. 5). The output of the wavelength division multiplexer 320 is amplitude modulated (step 520 in FIG. 5) by an amplitude modulator 325. The amplitude modulator 325 divides the beam into discrete pulses in time, surrounded by "gaps" of no signal, for purposes of time multiplexing. The amplitude modulator 325 produces a train of square pulses with a desired pulse repetition rate. Thus, as a result of the amplitude modulation, each wavelength $\lambda_i$ is operating in pulsed mode, and thus the system 300 can be considered a pulsed laser system. The output from the amplitude modulator 325 is split into the separate wavelengths, i.e., into its spectral components (step 530 in FIG. 5) using a wavelength division de-multiplexer 330.

Figure 4B:
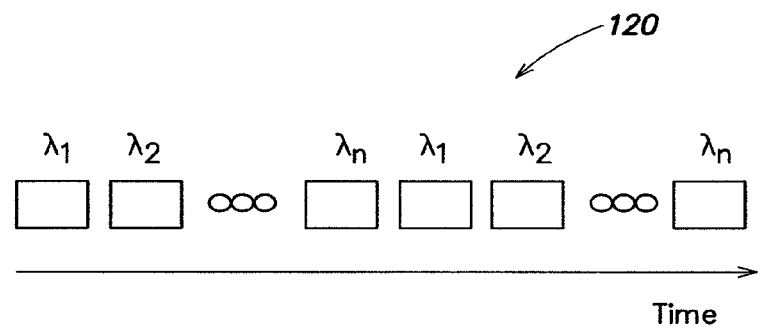
FIG. 4B is a diagram of one example of an amplified waveform output from the amplifier of FIG. 3 and corresponding to the input waveform of FIG. 4A.

The wavelength divisional de-multiplexer 330 is optically coupled to an array of optical fibers 335. The fibers of the array may be active (i.e., are gain fibers or fiber amplifiers) or passive; however, the fibers are generally passive in many applications. In one example, each fiber in the array 335 has a unique length. The variable fiber lengths in the array impart a variable delay to the spectral components output from the wavelength divisional de-multiplexer 330 (step 540 in FIG. 5). By delaying each spectral component a unique amount, the spectral components can be interleaved in time, thereby creating a waveform comprising a serial chain of spectral components 140, as illustrated in FIG. 1. The output from the fiber array 335 is spatially multiplexed (step 550 in FIG. 5) using a second wavelength division multiplexer 340 to produce the waveform beam 120 that is used to seed the amplifier 130. As a result, the output from the amplifier 130 is ideally a nearly continuous waveform chirped in wavelength. An example of the waveform 120 is illustrated in FIG. 4B. As discussed above, because the spectral components are separate in time, each spectral component can be individually amplified by the amplifier 130, and then re-overlapped in time, as discussed further below, to generate a very high power beam. If the spectral components were not separated in time, the amplifier 130 would need to amplify a relatively large power beam all at once, thus limiting (due to non-linearities) the overall amplification that can be achieved. By contrast, by uniquely delaying each spectral component, the power of the input waveform to the amplifier 130 is spread over the various wavelengths/spectral components, and each component can therefore be amplified to a greater degree, and a very high peak power final output beam 170 can be achieved.

Still referring to FIG. 3, as discussed above, the output beam 140 from the amplifier 130 is spatially spectrally dispersed and then recombined, spatially and temporally, to produce the high peak power output beam 170. In one example, a second wavelength division de-multiplexer 345 (corresponding to the dispersive optics 150) is used to spatially disperse the output beam from the amplifier 130 into its spectral components (step 230 in FIG. 2). The spectral components are then uniquely delayed, as discussed above, using a second array of optical fibers with variable fiber length to create the variable delay between different spectral components (step 240 in FIG. 2) and temporally recombine the spectral components into a single beam. The delayed spectral components are spatially recombined (step 250 in FIG. 2) using a transform lens 350 and grating 355. The transform lens 350 spatially overlaps the different spectral components, creating a region of overlap at the grating 355, as shown in FIG. 3, and the output beam 170 is transmitted by the grating 355. Spatial overlap of the spectral components can be ensured by placing the grating 355 one focal length away from the transform lens 350. Thus, the peak power of each pulse increases by the number of spectral components. In one example, the peak power scales by the number of spectral components in the waveform 120. In another example, as discussed below, the system can be configured to scale the peak power by the number of wavelengths squared.

Figure 4C:
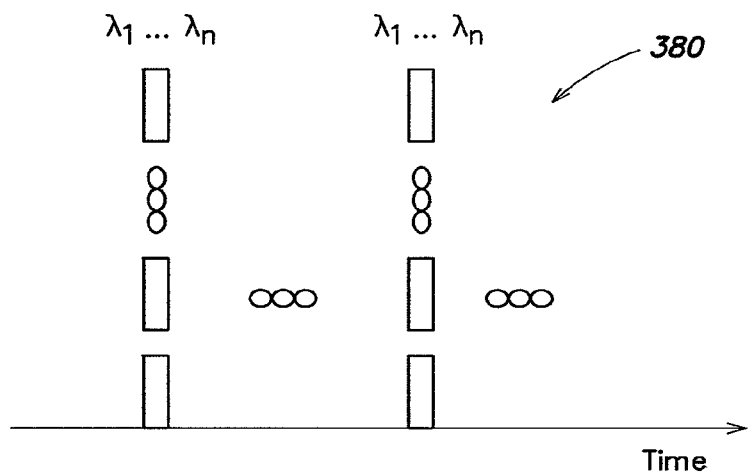
FIG. 4C is a diagram of one example of a sampled output waveform from the system of FIG. 3 corresponding to the amplified waveform of FIG. 4B.
Figure 6:
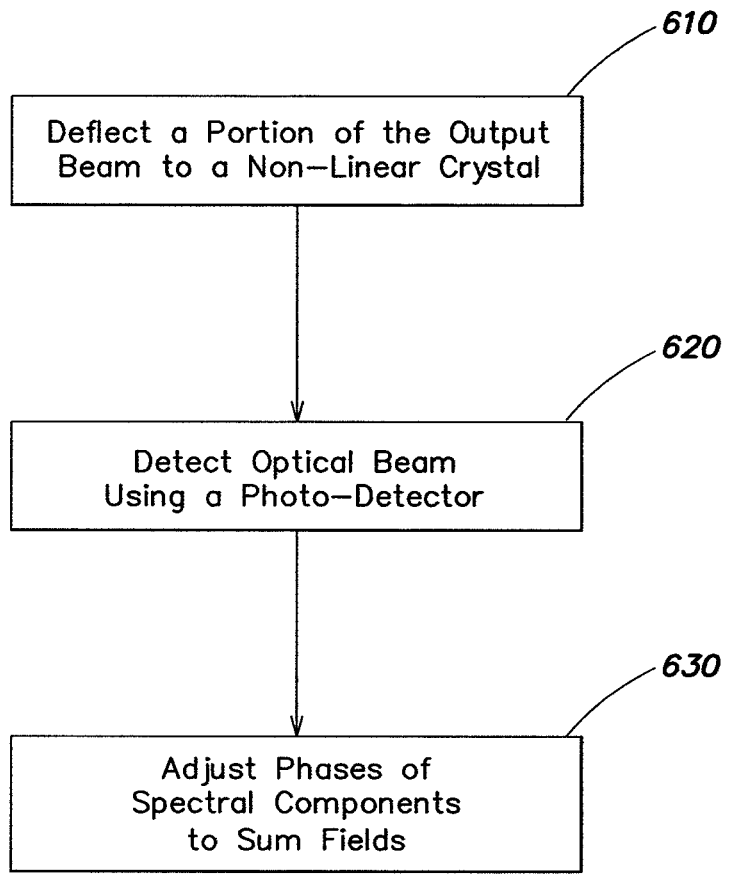
FIG. 6 is a flow diagram illustrating one example of a method of coherent addition of different wavelengths to optimize peak power.

According to one embodiment, to further increase the peak power, all the spectral components of the beam can be phased. If the spectral components are not phased, when the spectral components are recombined into a single beam, the power in each spectral component is added; hence the peak power of the output beam scales according to the number of spectral components. When the spectral components are phased, the electric fields are added in addition to the power summation. As a result, the peak power of the output beam scales with the number of spectral components squared. In addition, when the spectral components are phased, the pulse length is shortened, further resulting in an increase in the peak power. Phasing can be accomplished by sampling part of the output beam 170 with a non-linear crystal 360 and a photo-detector 365, and an example of the method illustrated in FIG. 3. A beam sampler or beam splitter 370 is used to deflect part of the output beam 170 to the non-linear crystal 360 (step 610 in FIG. 6) which directs the beam to the photo-detector 365 (step 620). In one example, the non-linear crystal is a doubling crystal. An example of the waveform 380 provided to the photo-detector 365 is illustrated in FIG. 4C. The output from the photo-detector 365 is fed to a phase controller 375. In one example, the phase controller 375 is a stochastic parallel gradient descent (SPGD) phase controller. The phase controller adjusts the phases of each wavelength such that the electromagnetic fields sum at given times (step 630 in FIG. 6). As a result, the peak power of each pulse of the output beam 170 is $N^2$ higher as compared to the peak power of each pulse when it is output from the amplifier 130, where N is the number of spectral components in the waveform. In order for the system to operate correctly, the array of CW master oscillators is configured to preserve beam coherence over a time span exceeding NT, where T is the pulse interval.

Figure 7:
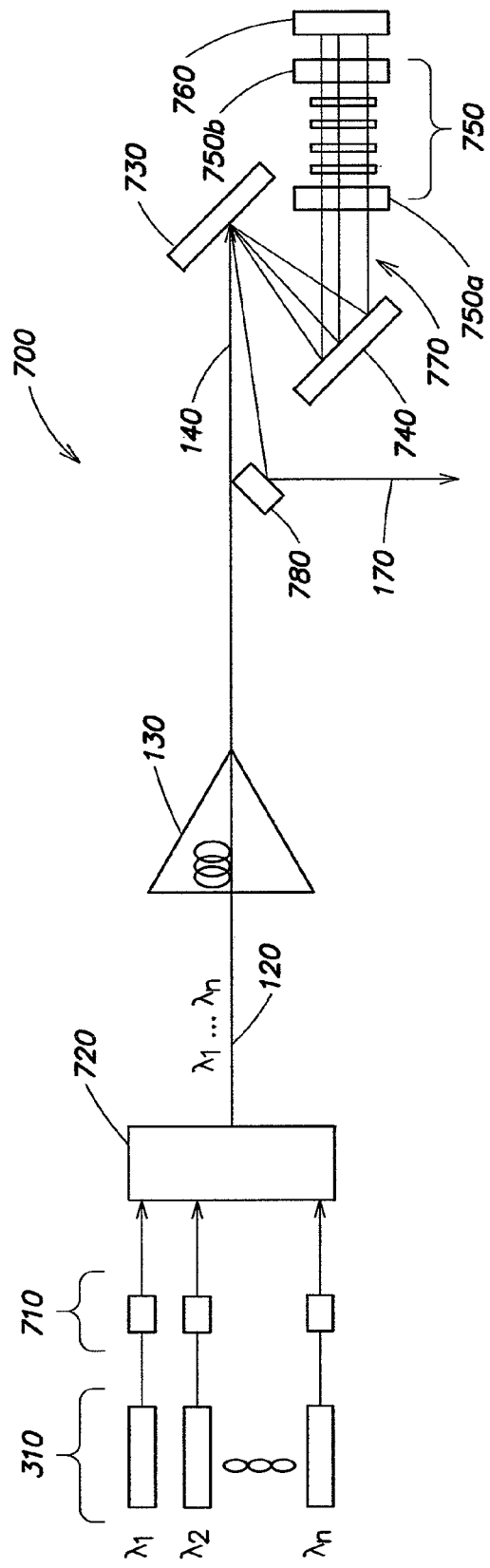
FIG. 7 is a block diagram of another example of a high peak power optical amplifier system according to aspects of the invention.

Referring to FIG. 7, there is illustrated another embodiment of an optical amplifier system that uses bulk optics (as opposed to fiber optics) to spatially and temporally overlap the different wavelengths, or spectral components, to produce a high peak power output beam. In one example system 700, illustrated in FIG. 7, diffraction gratings are used to spatially and temporally overlap the spectral components, as discussed further below. As discussed above, an array of master oscillators 310 produce an input waveform having a plurality of different wavelengths $\lambda_1$-$\lambda_n$. An example of the input waveform 315 is illustrated in FIG. 4A. In the example system illustrated in FIG. 7, an array of amplitude modulators 710 is used to amplitude modulate each wavelength $\lambda_i$ to operate the system 700 in pulsed mode. The amplitude modulated wavelengths are combined into the waveform 120 (an example of which is illustrated in FIG. 4B) using an n×1 combiner 720, where n is the number of unique wavelengths in the input waveform 315.

According to one embodiment, in the system of FIG. 7, the dispersive optics 150 and delay optics 160 of FIG. 1 comprise two gratings, namely, a first diffraction grating 730 and a diffraction second grating 740, a two-mirror beam shaper 750, and a mirror 760. The first diffraction grating 730 spatially disperses the incidence beam 140 from the amplifier 130 into its spectral components (step 230 in FIG. 2). The second diffraction grating 740 redirects all the spectral components into parallel beams 770. The beam-shaper 750 comprises two parallel mirrors 750a, 750b, which are disposed at an angle with respect to the incoming parallel beams 770. The beam shaper 750 delays each spectral component uniquely. The amount of delay depends on the separation between the mirrors 750a and 750b, the angle of incidence of the parallel beams 770, and the wavelength of each beam. An example of a beam shaper 750 that may be used in the system 700 is described in an article entitled "Two-mirror beam-shaping technique for high-power diode bars," W. A. Clarkson and D. C. Hanna, Opt. Lett. 21, 375 (1996), which is hereby incorporated herein by reference. Thus, each spectral component is uniquely delayed by the beam shaper 750 to temporally re-overlap the spectral components and is reflected off the last mirror 760 to be returned to the gratings 740 and 730. The output beam 170 is taken slightly off angle from the incidence beam 140 at the first grating 730 using another mirror 780.

Figure 8:
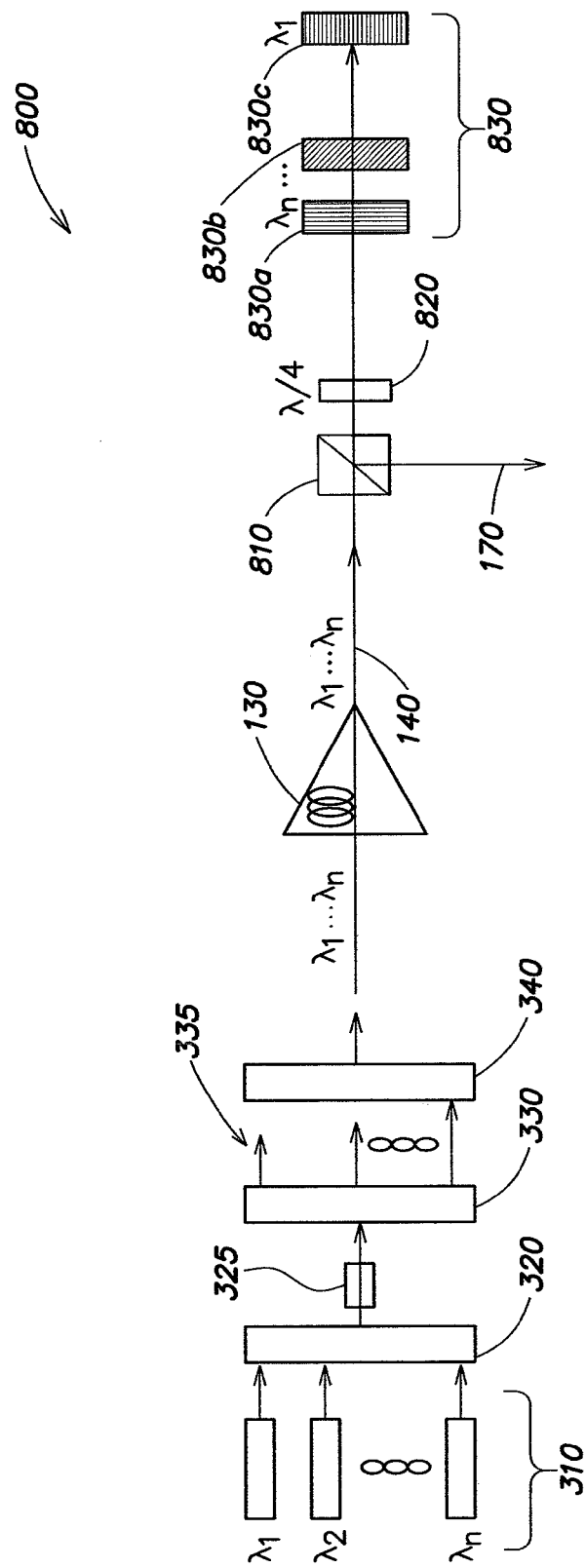
FIG. 8 is a block diagram of another example of a high peak power optical amplifier system according to aspects of the invention.

Referring to FIG. 8, there is illustrated another embodiment of an optical amplifier system 800. In this embodiment, the dispersive optics 150 and delay optics 160 comprise a polarization beam splitter 810, a quarter wave plate 820, and a series of volume Bragg gratings 830. In this example, the beam 140 from the amplifier 130 is transmitted through the polarization beam splitter 810 and the phase is altered by the quarter wave plate 820. Each wavelength is delayed uniquely by the series of volume Bragg gratings 830 to temporally overlap the spectral components. For example, a first reflective volume Bragg grating 830a may be resonant with $\lambda_n$, such that it reflects $\lambda_n$ and transmits all other wavelengths. Similarly, a second volume Bragg grating 830b may be resonant with $\lambda_{n-1}$, such that it reflects $\lambda_{n-1}$ and transmits all remaining wavelengths. Thus, the series progresses, with a larger delay added to each wavelength until the last volume Bragg grating 830c reflects $\lambda_1$. It is to be appreciated that many different arrangements of the series of volume Bragg gratings may be implemented and the invention is not limited to the specific configuration discussed above and illustrated in FIG. 8. For example, the series may be reversed, with the largest delay added to $\lambda_n$ and the smallest delay added to $\lambda_1$. As will be recognized by those skilled in the art, given the benefit of this disclosure, a variety of delay patterns may be achieved by appropriately arranging the elements of the volume Bragg grating array 830. The reflected wavelengths are further delayed by the quarter wave plate 820, such that they are no longer transmitted by the polarization beam splitter 810, but instead reflected at an angle to provide the output beam 170, as shown in FIG. 8. Thus, the combination of the polarization beam splitter 810 and the quarter wave plate 820 cause the light beam to change direction. The polarization beam splitter 810 and quarter wave plate 820 may be replaced with a Faraday circulator.

Figure 9:
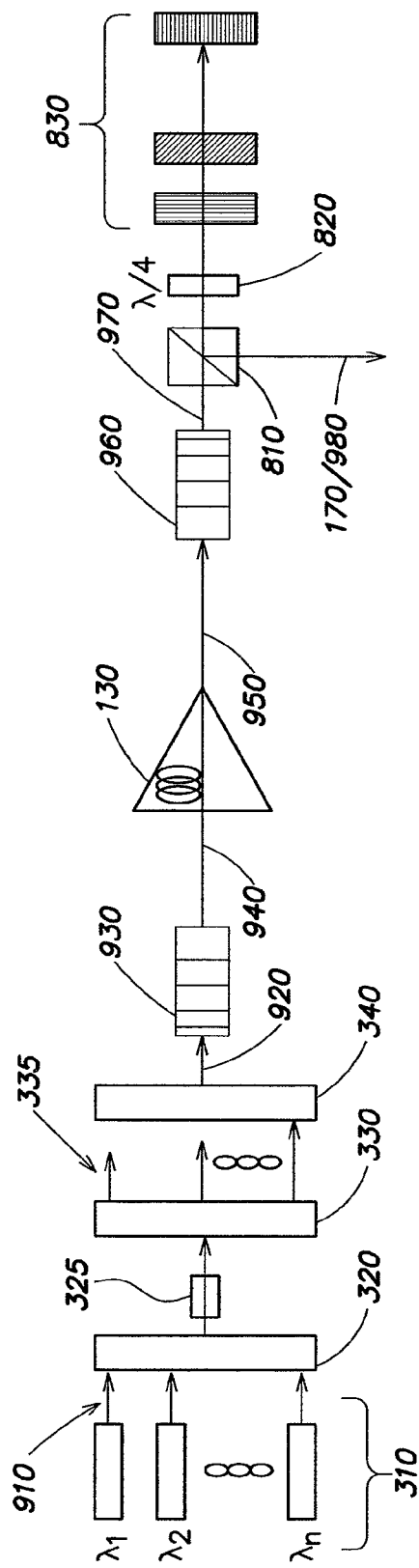
FIG. 9 is a block diagram of another example of a high peak power optical amplifier system according to aspects of the invention.
Figure 10A:
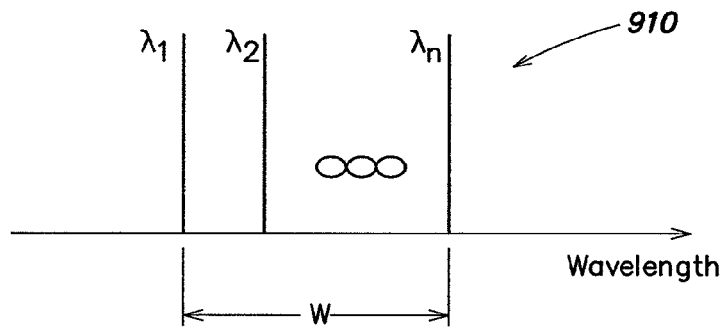
FIG. 10A is a diagram of one example of an input waveform to the system of FIG. 9.
Figure 10B:
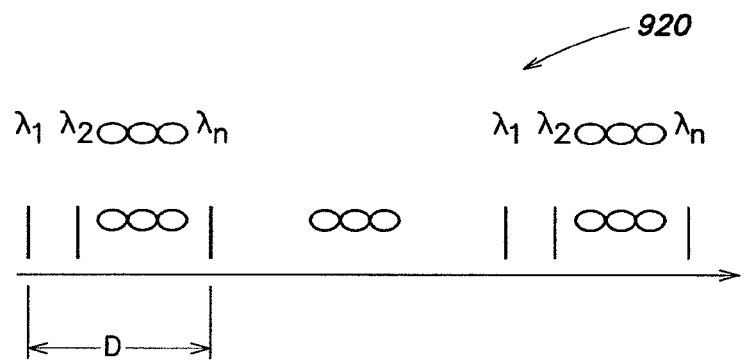
FIG. 10B is a diagram of one example of an input waveform to the first pulse divider in the system of FIG. 9 corresponding to the input waveform of FIG. 10A.

Another embodiment of a high power optical amplifier system is illustrated in FIG. 9. This implementation is similar to the embodiment illustrated in FIG. 8, but includes pulse dividers at the input and output of the amplifier 130. This implementation is suitable for very short pulses, for example, picosecond to femtosecond pulses. An example of an input pulse 910 generated by the array of master oscillators 310 is illustrated in FIG. 10A. As discussed above, the pulse comprises a plurality of wavelengths $\lambda_1$-$\lambda_n$. In one example, the pulse has a frequency span W of approximately 1000 gigahertz (GHz). FIG. 10B illustrates an example of a waveform 920, corresponding to the input pulse 910, that is provided to the input of the first pulse divider 930. In one example, the pulse has a duration D equal to approximately 100 nanoseconds (ns). The pulse divider 930 divides each pulse into many smaller amplitude pulses. In one example, the first pulse divider 930 comprises a number of birefringent crystals, and each pulse is divided into a number of smaller pulses equal to $2^N$, where N is the number of birefringent crystals. Examples of such pulse dividers using birefringent crystals are described in "Picosecond pulse stacking in calcite," H. E. Bates, R. R. Alfano, and N. Schiller, Appl. Opt. 18, 947 (1979) and "Divided-pulse amplification of ultrashort pulses," S. Zhou, F. W. Wise, and D. G. Ouzounov, Opt. Lett. 32, 871 (2007), each of which is hereby incorporated herein by reference.

Figure 10C:
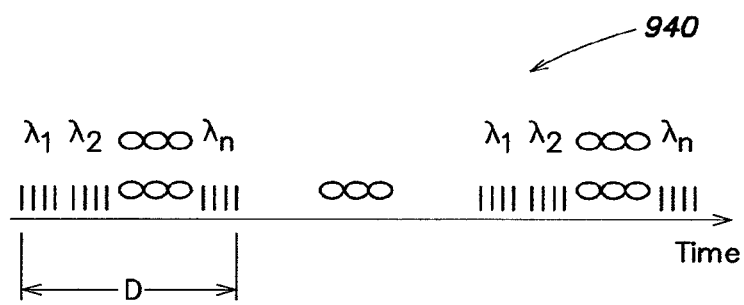
FIG. 10C is a diagram of one example of a waveform provided from the pulse divider to the amplifier of FIG. 9 and corresponding to the input waveform of FIG. 10B.
Figure 10D:
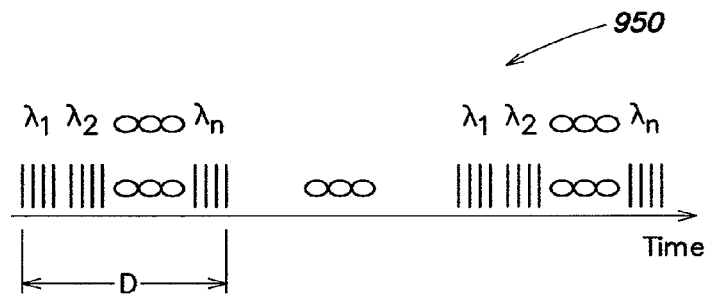
FIG. 10D is a diagram of one example of an amplified waveform provided to the second pulse divider in the system of FIG. 9 and corresponding to the waveform of FIG. 10C.
Figure 10E:
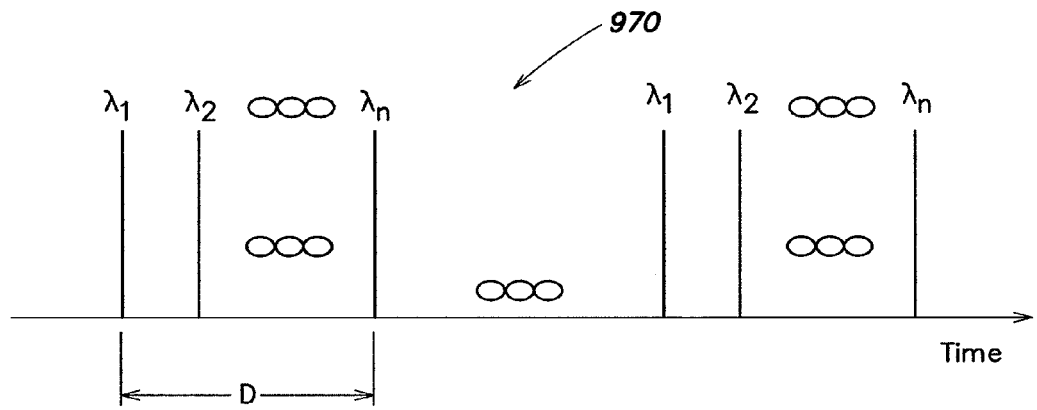
FIG. 10E is a diagram of one example of a recompressed waveform corresponding to the amplified waveform of FIG. 10D.
Figure 10F:
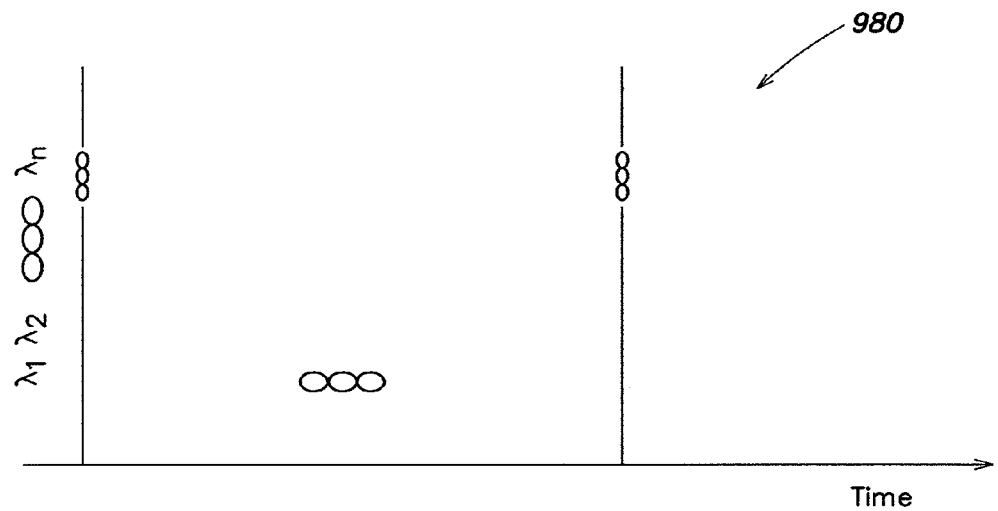
FIG. 10F is a diagram of one example of an output waveform from the system of FIG. 9 and corresponding to the waveform of FIG. 10E.

In one embodiment, the first birefringent crystal is oriented at 45 degrees with respect to the input beam 920. The first crystal will, with an appropriate crystal thickness, generate two pulses with orthogonal polarization due to the index of refraction for the two polarizations. These two pulses are further split by a second crystal, and so on. Thus, each input pulse generates $2^N$ pulses, where N is the number of birefringent crystals. For example, for a pulse divider 930 comprising 10 crystals, a 1 picosecond (ps) input pulse is stretched 1024 times to generate a 1 ns pulse at the output of the pulse divider 930. An example of the stretched pulse waveform 940, corresponding to the input pulse 920 of FIG. 10B, is illustrated in FIG. 10C. Thus according to one embodiment, each pulse at a unique wavelength is stretched by the first pulse divider 930 and then amplified by amplifier 130. An example of the amplified waveform 950 is illustrated in FIG. 10D. The amplified waveform 950 is provided to the second pulse divider 960, where each wavelength is recompressed, and the resulting waveform 970 is processed through the optical components as discussed above with reference to FIG. 8 to provide the output beam 170. An example of the waveform 970, corresponding to the waveform 950 shown in FIG. 10D, is illustrated in FIG. 10E. An example of the output waveform 170 corresponding to the waveform 970 illustrated in FIG. 10E is waveform 980 illustrated in FIG. 10F.

Figure 11:
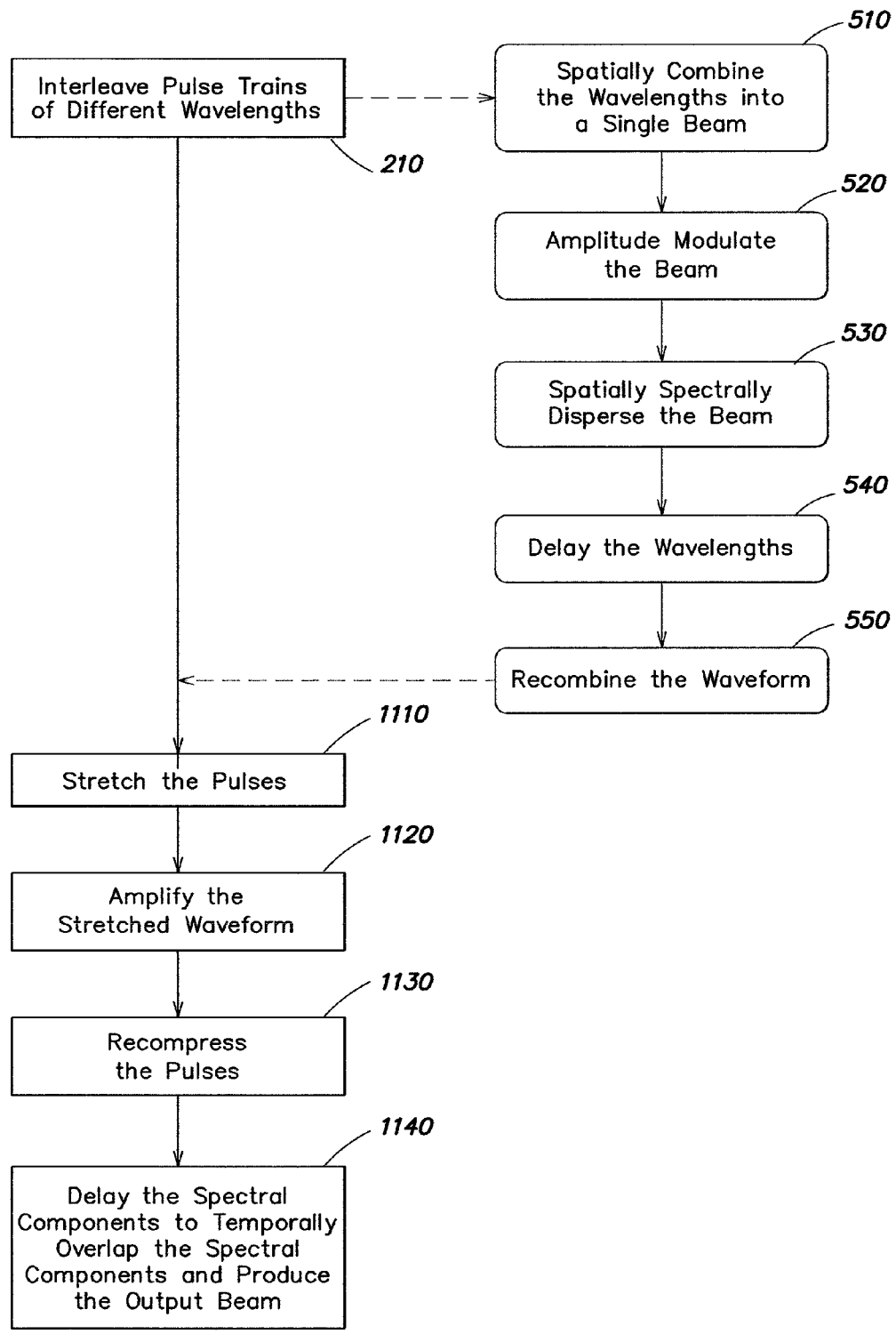
FIG. 11 is a flow diagram of one example of a method of generating a high peak power output beam according to aspects of the invention.

Referring to FIG. 11, there is illustrated a flow diagram of one example of a method of generating an high peak power output beam 170 using an embodiment of the system illustrated in FIG. 9. As discussed above, in step 210, pulse trains of different wavelengths are interleaved. In one example, as discussed above with reference to FIGS. 3 and 5, step 210 includes spatially combining the wavelengths into a single beam using a wavelength division multiplexer 320 (step 510), amplitude modulating the output of the wavelength division multiplexer (step 520), splitting the output from the amplitude modulator 325 into its spectral components (step 530) using a wavelength division de-multiplexer 330, uniquely delaying the spectral components using an array of optical fibers 335 with variable fiber length (step 540), and spatially multiplexing (step 550) the output from the fiber array 335 using a second wavelength division multiplexer 340 to produce the waveform beam 920. In step 1110, the pulses of the waveform 920 are stretched using the first pulse divider 930, as discussed above. The stretched pulses are then amplified with amplifier 130 (step 1120), and recompressed using the second pulse divider 960 (step 1130). In one example, each wavelength of the waveform 970 is uniquely delayed by the series of volume Bragg gratings 830 (step 1140) to temporally recombine the wavelengths, and the output beam 980 is taken at an angle off the polarization beam splitter 810.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An optical amplifier system comprising:
a plurality of seed laser sources each configured to generate an optical beam having a unique wavelength to provide a plurality of wavelengths;
a wavelength division multiplexer configured to spatially overlap the plurality of wavelengths to form a first beam;
an amplitude modulator configured to receive the first beam and to amplitude modulate the first beam to form a modulated beam;
a wavelength division de-multiplexer configured to receive the modulated beam and to spatially spectrally disperse the modulated beam into a plurality of modulated wavelengths;
first delay optics optically coupled to the wavelength division de-multiplexer and configured to receive and uniquely delay each wavelength of the plurality of modulated wavelengths to provide a waveform comprising a first time series of the plurality of modulated wavelengths;
an amplifier configured to receive the waveform and to amplify each wavelength of the plurality of modulated wavelengths to provide an amplified waveform comprising a second time series of a corresponding plurality of amplified modulated wavelengths; and
second delay optics configured to temporally overlap the plurality of amplified modulated wavelengths to provide an output beam.

2. The optical amplifier system as claimed in claim 1, further comprising dispersive optics optically coupled between the amplifier and the second delay optics and configured to receive and spatially spectrally disperse the amplified modulated waveform.

3. The optical amplifier system as claimed in claim 2, wherein the dispersive optics comprise at least one of a wavelength division de-multiplexer, a diffraction grating, a beam splitter, and a mirror.

4. The optical amplifier system as claimed in claim 2, further comprising:
a transform lens optically coupled to the second delay optics and configured to receive the plurality of amplified modulated wavelengths that have been temporally overlapped by the second delay optics and to spatially overlap the plurality of amplified modulated wavelengths to form the output beam; and
a grating optically coupled to the transform lens and positioned a focal length from the transform lens at a region of overlap of the plurality of amplified modulated wavelengths, the grating configured to transmit the output beam.

5. The optical amplifier system as claimed in claim 4, further comprising:
a non-linear crystal;
a beam splitter configured to deflect a portion of the output beam to the non-linear crystal;
a photo-detector optically coupled to the non-linear crystal and configured to detect a beam from the non-linear crystal; and
a phase controller optically coupled to the photo-detector and to the wavelength division de-multiplexer, the phase controller being configured to receive a detected beam from the photo-detector and to adjust a phase of each wavelength in the detected beam so as to sum electromagnetic fields of the plurality of amplified modulated wavelengths.

6. The optical amplifier system as claimed in claim 5, wherein the phase controller is a stochastic parallel gradient descent phase controller.

7. The optical amplifier system as claimed in claim 2, wherein the dispersive optics comprises:
a first diffraction grating optically coupled to the amplifier and configured to spatially spectrally disperse the plurality of amplified wavelengths; and
a second diffraction grating optically coupled to the first diffraction grating and configured to redirect the plurality of amplified wavelengths into parallel beams.

8. The optical amplifier system as claimed in claim 7, wherein the second delay optics comprises:
a two-mirror beam shaper configured to receive the parallel beams and to uniquely delay each wavelength of the plurality of amplified modulated wavelengths to temporally overlap the plurality of amplified modulated wavelengths to provide the output beam.

9. The optical amplifier system as claimed in claim 2, wherein the dispersive optics and the second delay optics together comprise:
a polarization beam splitter optically coupled to the amplifier;
a quarter wave plate optically coupled to the polarization beam splitter; and
a series of volume Bragg gratings optically coupled to the quarter wave plate and configured to uniquely delay each wavelength of the plurality of amplified modulated wavelengths to temporally overlap the plurality of amplified modulated wavelengths to provide the output beam.

10. The optical amplifier system as claimed in claim 1, wherein at least one of the first and second delay optics comprises an array of optical fibers having different lengths.

11. The optical amplifier system as claimed in claim 1, further comprising:
a second wavelength division multiplexer configured to spatially overlap the plurality of wavelengths to form a second optical beam;
a first pulse divider coupled to the output of the second wavelength division multiplexer and also coupled to the input of the amplifier configured to stretch temporally and divide an input pulse into a plurality of smaller amplitude pulses; and
a second pulse divider coupled to the output of the amplifier configured to recompress temporally and combine the plurality of smaller amplitude pulses into a combined pulse.

12. The optical amplifier system as claimed in claim 11, wherein the first pulse divider comprises a plurality of birefringent crystals.

13. The optical amplifier system as claimed in claim 12, wherein the plurality of birefringent crystals consists of a set of an integer number N birefringent crystals configured to generate a set of $2^N$ pulses.

14. The optical amplifier system as claimed in claim 11, wherein the second pulse divider comprises a plurality of birefringent crystals.

15. The optical amplifier system as claimed in claim 14, wherein the plurality of birefringent crystals consists of a set of an integer number N birefringent crystals configured to combine a set of $2^N$ pulses.

16. A method of producing a high peak power output optical beam comprising:
uniquely delaying each wavelength of a plurality of wavelengths to temporally interleave the plurality of wavelengths to form a waveform comprising a first time series of the plurality of wavelengths;
amplifying each wavelength of the plurality of wavelengths to provide an amplified waveform comprising a second time series of a corresponding plurality of amplified wavelengths;
phasing the plurality of amplified wavelengths;
spatially spectrally dispersing the plurality of amplified wavelengths;
uniquely delaying each amplified wavelength to temporally overlap the plurality of amplified wavelengths; and
spatially overlapping the plurality of amplified wavelengths, after temporally overlapping the plurality of amplified wavelengths, to form the output optical beam.

17. The method as claimed in claim 16, further comprising:
spatially overlapping the plurality of wavelengths to form an input optical beam;
amplitude modulating the input optical beam to provide a modulated beam; and
spatially spectrally dispersing the modulated beam to provide the plurality of wavelengths.

18. The method as claimed in 16, wherein the plurality of wavelengths corresponds to a plurality of pulses, and further comprising:
stretching each pulse of the plurality of pulses to provide a plurality of stretched pulses;
amplifying the plurality of stretched pulses to provide a plurality of amplified stretched pulses; and
recompressing the plurality of amplified stretched pulses to provide the plurality of amplified wavelengths.

19. The method as claimed in claim 18, wherein stretching each pulse of the plurality of pulses comprises dividing each pulse of the plurality of pulses into a plurality of smaller amplitude pulses.

20. A method of producing a high peak power output optical beam comprising:
generating a plurality of unique wavelengths from a plurality of seed laser sources;
spatially overlapping the plurality of unique wavelengths to form a first beam;
modulating the amplitude of the first beam to produce a modulated beam;
dispersing the modulated beam spatially and spectrally into a plurality of modulated wavelengths;
uniquely delaying each wavelength of the plurality of modulated wavelengths to interleave temporally the plurality of modulated wavelengths to provide a waveform comprising a first time series of the plurality of modulated wavelengths;
amplifying each wavelength of the plurality of modulated wavelengths to provide an amplified waveform comprising a second time series of a corresponding plurality of amplified modulated wavelengths; and
uniquely delaying each wavelength of the plurality of amplified modulated wavelengths to temporally overlap the plurality of amplified modulated wavelengths to provide an output beam.

21. The method as claimed in claim 20, further comprising spatially spectrally dispersing the amplified waveform.

22. The method as claimed in claim 21, further comprising:
after temporally overlapping the plurality of amplified modulated wavelengths, spatially overlapping the plurality of amplified modulated wavelengths with a transform lens to form the output beam; and
transmitting the output beam with a grating optically coupled to the transform lens and positioned a focal length from the transform lens at a region of overlap of the plurality of amplified wavelengths.

23. An optical amplifier system comprising:
a plurality of seed laser sources each configured to generate an optical beam having a unique wavelength to provide a plurality of wavelengths;
first delay optics configured to delay uniquely each wavelength of the plurality of wavelengths to provide a waveform comprising a first time series of the plurality of wavelengths;
an amplifier configured to receive the waveform and to amplify each wavelength of the plurality of wavelengths to provide an amplified waveform comprising a second time series of a corresponding plurality of amplified wavelengths;
second delay optics configured to temporally overlap the plurality of amplified wavelengths;
a non-linear crystal;
a beam splitter configured to deflect a portion of the amplified waveform to the non-linear crystal;
a photo-detector optically coupled to the non-linear crystal and configured to detect a beam from the non-linear crystal; and
a phase controller optically coupled to the photo-detector, the phase controller being configured to receive a detected beam from the photo-detector and to adjust the phase of each amplified wavelength of the plurality of amplified wavelengths so as to sum electromagnetic fields of the plurality of amplified wavelengths.

24. The optical amplifier system as claimed in claim 23, further comprising a first wavelength division multiplexer located between the plurality of seed laser sources and the amplifier and configured to spatially overlap the plurality of wavelengths to form an input beam.

25. The optical amplifier system as claimed in claim 24, further comprising:
an amplitude modulator configured to receive the input beam and to amplitude modulate the input beam to form a modulated beam; and
a first wavelength division de-multiplexer located between the amplitude modulator and the second delay optics and configured to spatially spectrally disperse the modulated beam into a plurality of modulated wavelengths.

26. The optical amplifier system as claimed in claim 25, further comprising a second wavelength division de-multiplexer located between the amplifier and the second delay optics and configured to receive the amplified waveform and to spatially spectrally disperse the amplified waveform into a plurality of amplified wavelengths.

27. The optical amplifier system as claimed in claim 26, further comprising a transform lens and a grating located between the second delay optics and the nonlinear crystal and configured to spatially overlap the plurality of amplified wavelengths to provide an output beam.

* * * * *